US008194450B2

(12) United States Patent
Lee

(10) Patent No.: US 8,194,450 B2
(45) Date of Patent: *Jun. 5, 2012

(54) METHODS AND CONTROL CIRCUITRY FOR PROGRAMMING MEMORY CELLS

(75) Inventor: June Lee, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 58 days.

This patent is subject to a terminal disclaimer.

(21) Appl. No.: 12/815,979

(22) Filed: Jun. 15, 2010

(65) Prior Publication Data

US 2010/0246262 A1 Sep. 30, 2010

Related U.S. Application Data

(63) Continuation of application No. 12/368,666, filed on Feb. 10, 2009, now Pat. No. 7,738,294, which is a continuation of application No. 11/782,866, filed on Jul. 25, 2007, now Pat. No. 7,489,543.

(51) Int. Cl.
  *G11C 16/00* (2006.01)
(52) U.S. Cl. ............................... 365/185.03; 365/185.24
(58) Field of Classification Search .................... 365/168
  See application file for complete search history.

(56) References Cited

U.S. PATENT DOCUMENTS

| 5,903,495 | A  | * | 5/1999 | Takeuchi et al. ......... 365/185.03 |
| 5,959,882 | A  |   | 9/1999 | Yoshida et al. |
| 6,166,950 | A  |   | 12/2000 | Yamada et al. |
| 6,456,528 | B1 | * | 9/2002 | Chen ......................... 365/185.03 |
| 6,944,068 | B2 |   | 9/2005 | Quader et al. |
| 7,020,017 | B2 |   | 3/2006 | Chen et al. |
| 7,170,780 | B2 |   | 1/2007 | Kawai |
| 7,447,067 | B2 |   | 11/2008 | Kong et al. |
| 7,457,178 | B2 |   | 11/2008 | Tu et al. |
| 7,602,652 | B2 | * | 10/2009 | Kamei ...................... 365/185.24 |
| 7,639,532 | B2 | * | 12/2009 | Roohparvar et al. .... 365/185.03 |
| 2008/0123407 | A1 |  | 5/2008 | Park |

OTHER PUBLICATIONS

Atwood, et al. "Intel StrataFlash Memory Technology Overview." Intel Technology Journal, Q4 1997.
Byeon, et al. "An 8Gb Multi-Level NAND Flash Memory with 63nm STI CMOS Process Technology." International Solid-State Circuit Conference Digest Tech. Papers. pp. 46-47. Feb. 7, 2005.
Fazio and Bauer. "Intel StrataFlash Memory Technology Development and Implementation." Intel Technology Journal, Q4 1997.
Hara, et al. "A 146mm2 8Gb NAND Flash Memory with 70nm CMOS Technology." International Solid-State Circuit Conference Digest Tech. Papers. pp. 44-45. Feb. 7, 2005.

* cited by examiner

*Primary Examiner* — Tan T. Nguyen
(74) *Attorney, Agent, or Firm* — Leffert Jay & Polglaze, P.A.

(57) ABSTRACT

Methods of programming memory cells and control circuitry for memory arrays facilitate a reduction of program disturb. A memory cell is shifted from a first data state to a second data state if it is desired to alter a first digit of a data value of the memory cell. If it is desired to alter a second digit of the data value of the memory cell, the memory cell is shifted to a third data state if the memory cell is in the first data state and shifted to a fourth data state if the memory cell is in the second data state. The first, second, third and fourth data states correspond to respective non-overlapping ranges of threshold voltages. The threshold voltages corresponding to the fourth data state are greater than the threshold voltages corresponding to the third data state.

25 Claims, 11 Drawing Sheets

METHODS AND CONTROL CIRCUITRY FOR PROGRAMMING MEMORY CELLS

RELATED APPLICATIONS

This application is a continuation of U.S. application Ser. No. 12/368,666 (allowed), filed Feb. 10, 2009 and titled "PROGRAMMING MULTILEVEL CELL MEMORY ARRAYS", now U.S. Pat. No. 7,738,294, which is a continuation of U.S. patent application Ser. No. 11/782,866 (now U.S. Pat. No. 7,489,543), filed Jul. 25, 2007 and titled "PROGRAMMING MULTILEVEL CELL MEMORY ARRAYS," which are commonly assigned and incorporated by reference in their entirety herein.

TECHNICAL FIELD

The present disclosure relates generally to memory devices and in a particular embodiment, the present disclosure relates to programming of multilevel-cell NAND memory arrays.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data, such as a basic input/output system (BIOS), are typically stored in flash memory devices for use in personal computer systems.

As the performance and complexity of electronic systems increase, the requirement for additional memory in a system also increases. However, in order to continue to reduce the costs of the system, it is desirable to keep the parts count low. This can be accomplished by increasing the memory density of an integrated circuit by using such technologies as multilevel cells (MLC). For example, MLC NAND flash memory is a cost effective non-volatile memory.

In a NAND type memory array architecture, the floating gate memory cells of the memory array are arranged in a matrix of rows and columns. The memory cells of the array are also arranged together in strings, typically of 8, 16, 32, or more each, where the memory cells in the string are connected together in series, source to drain, between a common source line and a column bit line. The array is then accessed by a row decoder activating a row of floating gate memory cells by selecting the word line connected to their gates. In addition, bit lines can also be driven high or low depending on the current operation being performed.

Multilevel memory cells take advantage of the analog nature of a traditional flash cell by assigning a data state (e.g., as represented by a bit pattern) to a specific range of threshold voltages (Vt) stored on the cell. This technology permits the storage of two or more bits per cell, depending on the quantity of threshold voltage ranges assigned to the cell and the stability of the assigned threshold voltage ranges during the lifetime operation of the memory cell. The number of threshold voltage ranges, which are sometimes also referred to a Vt distribution windows, used to represent a bit pattern comprised of N-bits is $2^N$. FIG. 1 illustrates an example of threshold voltage ranges 112, 114, 116, 118 as they might be assigned for a multiple level memory cell.

For example, a cell may be assigned a Vt that falls within one of four different voltage ranges 112, 114, 116, 118 of 200 mV, each being used to represent a data state corresponding to a bit pattern comprised of two bits. For example, the threshold voltage distribution 104 illustrates the range of threshold voltages 114 for multilevel memory cells assigned a data state of '10'. Typically, a dead space (which is also sometimes referred to as a margin) 110 of 0.2V to 0.4V is maintained between each range to keep the Vt distributions from overlapping. If the voltage stored on the cell is within the first Vt distribution 102, the cell in this example is storing a logical '11' state and is typically considered the erased state of the cell. If the voltage is within the second Vt distribution 104, the cell in this example is storing a logical '10' state. A voltage in the third distribution 106 would indicate that the cell in this example is storing a logical '00' state. Finally, a voltage in the fourth distribution 108, in this example, indicates that a logical '01' state is stored in the cell.

During programming of an individual multilevel cell, the cell's Vt is altered by moving, e.g., shifting, the Vt of the cell to fall within the threshold voltage distribution representative of the desired data value for that cell. However, MLC devices are generally more prone to program disturb issues where each cell may be subjected to multiple program operations to reach its desired Vt distribution. Multiple program operations are the result of programming one bit during each program operation. For example, a two-bit MLC may require two program operations to adjust the Vt to its desired state while a three-bit MLC may require three program operations to adjust the Vt to its desired state.

For the reasons stated above, and for other reasons which will become apparent to those skilled in the art upon reading and understanding the present specification, there is a need in the art for alternatives to existing programming schemes for MLC NAND flash memory devices.

DETAILED DESCRIPTION

Figure 1:
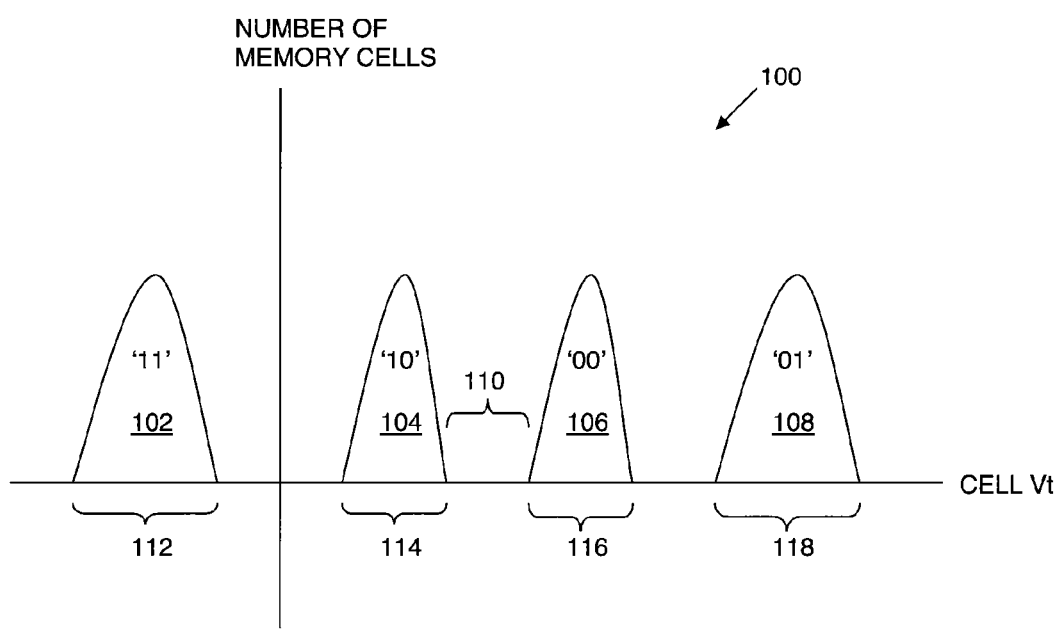
FIG. 1 is a diagram showing threshold voltage distributions for a multiple level memory cell.

In the following detailed description of the present embodiments, reference is made to the accompanying drawings that form a part hereof, and in which is shown, by way of illustration, specific embodiments in which the disclosure may be practiced. In the drawings, like numerals describe substantially similar components throughout the several views. These embodiments are described in sufficient detail to enable those skilled in the art to practice the embodiments. Other embodiments may be utilized and structural, logical, and electrical changes may be made without departing from the scope of the present disclosure. The following detailed description is, therefore, not to be taken in a limiting sense.

Figure 2:
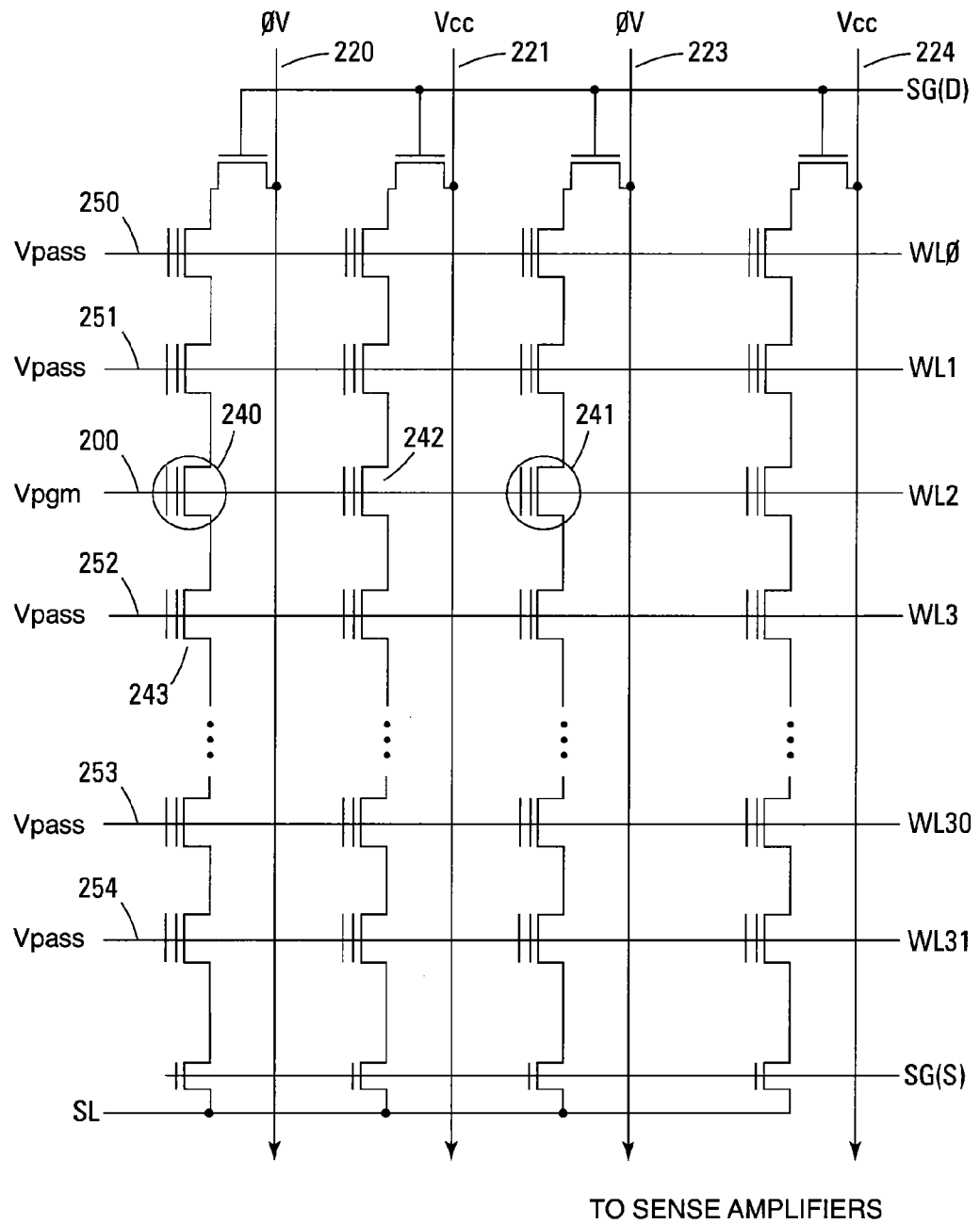
FIG. 2 is a schematic of a NAND memory array in accordance with one embodiment of the disclosure.

Multilevel memory cells take advantage of the analog nature of a traditional flash cell by assigning a data state to a specific threshold voltage (Vt) range stored on the cell. Should the programmed threshold voltages of the memory cells shift out of their programmed voltage ranges for some reason, incorrect data could be read from the memory cells during a read operation of the device resulting in corrupted data. One potential cause of a Vt shift in the memory cells is floating gate interference. Floating gate interference, sometimes referred to as program disturb or Vpass disturb, can occur during programming and is caused by capacitive coupling between memory cells being programmed and adjacent cells in the array. During a typical programming operation a high potential programming voltage (Vpgm) is applied to the word line containing the selected cells to be programmed. For example, two memory cells 240 and 241 may be selected for programming in FIG. 2. It will be appreciated by those skilled in the art that FIG. 2 is presented to help illustrate a programming operation of the present disclosure. Actual memory arrays can contain many more banks, rows, columns, and memory cells than are illustrated in FIG. 2. FIG. 2 shows Vpgm applied to a word line 200 which contains cells 240 and 241 that have been selected for programming. Unselected word lines 250-254 are biased by a Vpass potential that is less than the Vpgm voltage. For example, a Vpass voltage could be approximately 10V and the Vpgm voltage could be approximately 20V.

Bit lines are also biased depending on whether an associated column contains a memory cell that has been selected for programming Bit lines for columns containing memory cells selected for programming 220, 223 may be biased at 0V. Unselected columns 221, 224 bit lines may be biased at Vcc to inhibit programming. For example, the biasing of bit line 221 at Vcc is meant to inhibit programming of memory cell 242. Other Vpgm, Vpass and bit line voltages could be used as is known to those skilled in the art. As discussed, biasing unselected rows (word lines) with Vpass and unselected columns (bit lines) with Vcc is meant to inhibit programming of unselected memory cells. However, due to floating gate interference caused by capacitive coupling, unselected memory cells 242 and 243 could experience a shift, which is sometimes referred to as a disturb, in their programmed threshold voltage. For example, transistor 242 is not selected for programming. However, Vpgm is applied to the word line, and thus the gate of transistor 242, which could cause a disturbance in the transistor threshold voltage. This is commonly referred to as program disturb. Also, transistor 243 which is adjacent to the selected word line could also be affected by floating gate disturbance due to it's proximity to the selected memory cells. This is often referred to as Vpass disturb. Both Vpass and program disturb are undesirable occurrences and can lead to corrupted data in the memory array.

Figure 3A:
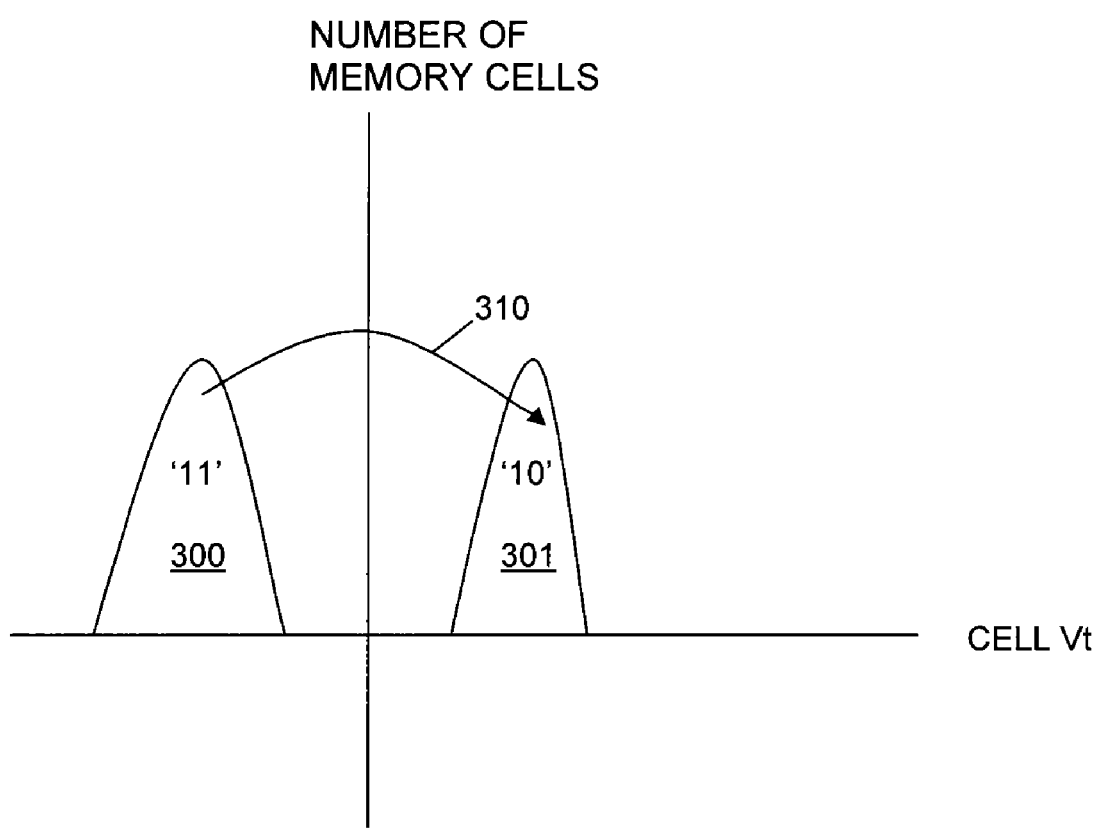
FIGS. 3A and 3B are diagrams illustrating a conventional MLC NAND programming method.
Figure 3B:
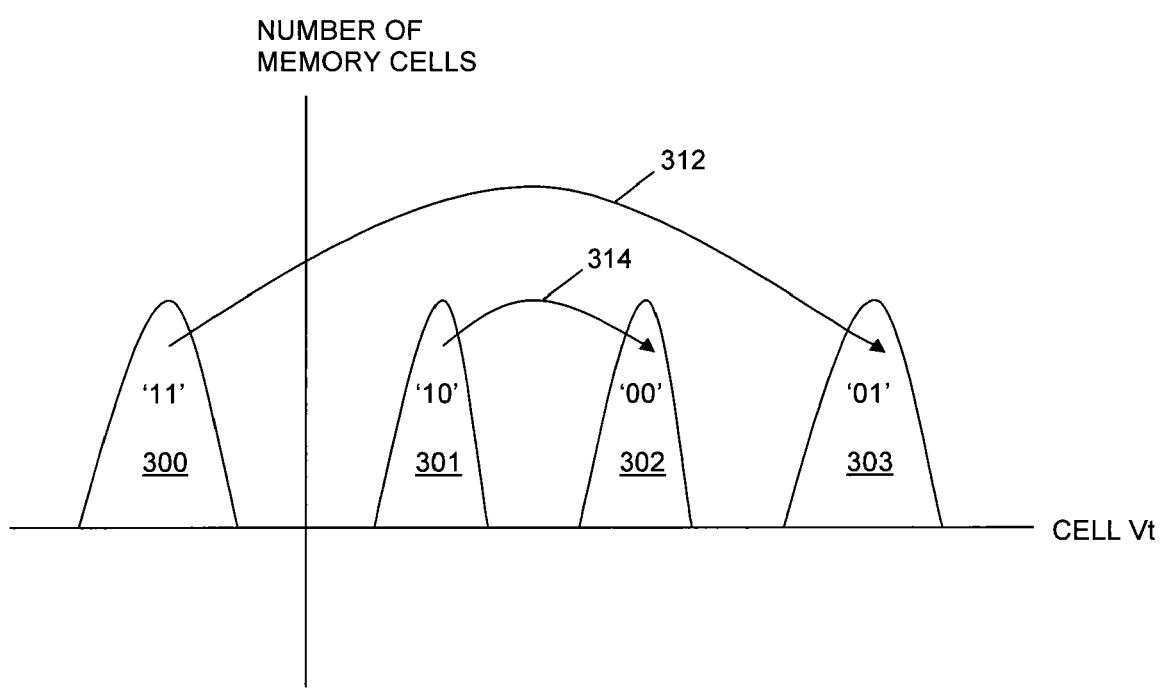

FIGS. 3A and 3B illustrate a conventional method of MLC NAND programming. During a programming operation, the data states (represented herein with bits) of multilevel memory cells are programmed in pages. For example, in a MLC storing a data value represented by the data state consisting of a pattern of two bits 'XY', the most significant bit (MSB page) is represented by X and the least significant bit (LSB page) is represented by Y. The LSB page is typically programmed first, followed by the MSB page. Programming of the LSB page is shown in FIG. 3A. Should the LSB to be stored be a first data value, such as a logical '1', then the Vt of the MLC will remain within the distribution shown at 300. As discussed above, Vt distribution 300 represents an erased state of the MLC. If the LSB to be programmed is a second data value, such as a logical '0', then the Vt is adjusted, e.g., shifted, by means of a programming operation to move the Vt of the MLC to within the distribution shown at 301. The arrow indicated at 310 is meant to illustrate the adjustment of the Vt as a result of a programming operation.

FIG. 3B illustrates a typical programming operation for the MSB page of a MLC storing a two bit pattern. In programming the MSB in this example, four possible voltage distributions exist 300-303. Typical programming bit patterns for the MSB page are illustrated in FIG. 3B. For example, if the LSB and MSB page contained a first data value, such as a logical '1', no shift in Vt would be made to the MLC and the Vt would remain within the distribution shown at 300. If the distribution is located at 301 (due to a logical '0' in the LSB page programming operation already discussed) and the MSB page to be programmed contains a second data value, such as a logical '0', the programming operation would shift the Vt to within the distribution shown at 302. Finally, if the LSB bit programmed previously contained a logical '1' and the MSB bit to be programmed is a logical '0', the Vt would be shifted to within the distribution located at 303. Again, the arrows indicated at 310, 312 and 314 are intended to illustrate the Vt shift due to a programming operation.

It is known to those skilled in the art that bits of a MLC are programmed by applying a set of programming pulses that increase with each successive pulse by some increment, resulting in the programming of the bits at a specific Vt level. The increment is referred to herein as Vstep. Smaller Vstep increments result in programming that takes longer than programming with larger Vstep increments, but the smaller Vstep increments allow for the threshold voltage ranges to be narrower in the MLC. However, the more the Vt of a memory cell needs to shift, for example the programming operation in FIG. 3B 312, the more programming pulses that will be required to shift the Vt of the cell being programmed. Increasing the number and magnitude of these programming pulses provides more opportunity for Vpass and program disturb to occur.

Figure 4A:
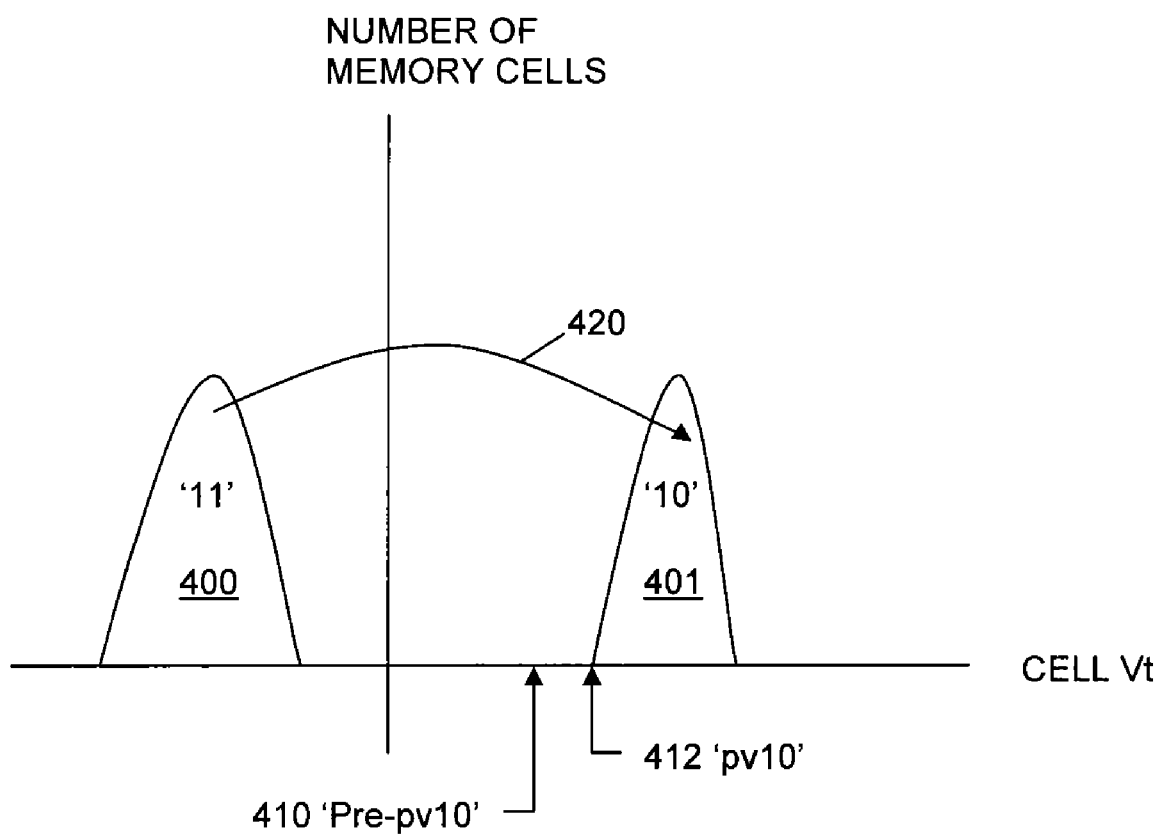
FIGS. 4A and 4B are diagrams illustrating a MLC programming method according to one embodiment of the disclosure.
Figure 4B:
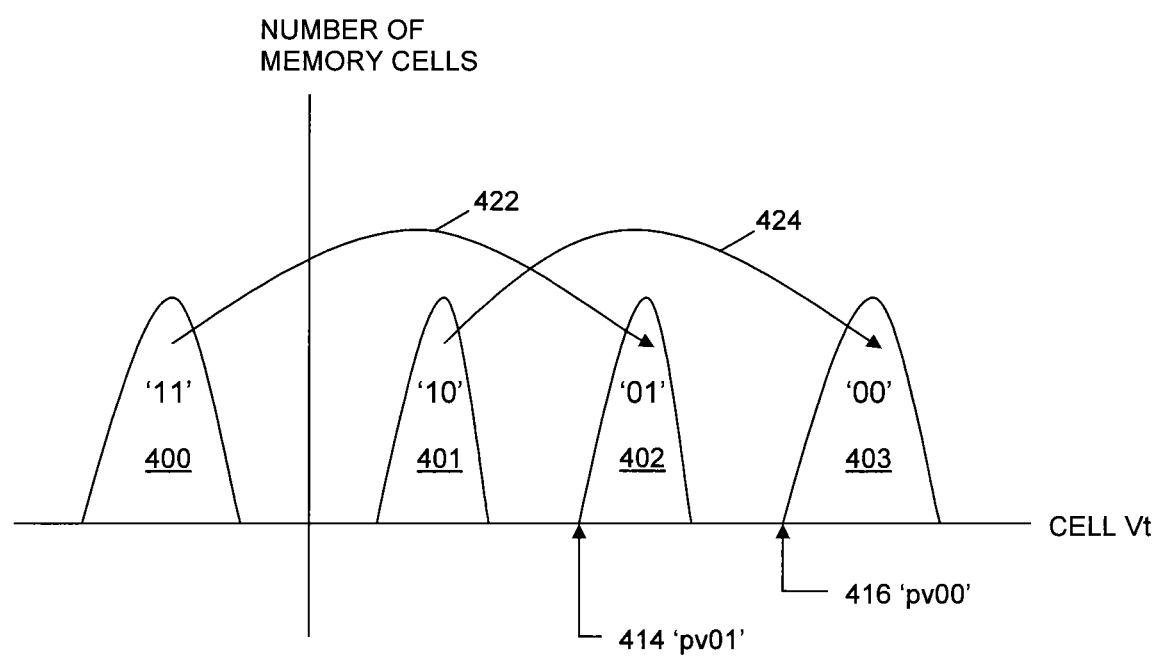

FIG. 4A illustrates a first portion of a MLC programming method, e.g., a LSB page programming method, and FIG. 4B illustrates a second portion of a MLC programming method, e.g., a MSB page programming method, according to one embodiment of the disclosure. Referring to FIG. 4A, there are two Vt distributions possible 400/401 for the LSB bit patterns in the first portion of the MLC programming method. These two bit patterns may be assigned bit patterns '11' as shown in distribution 400 and '10' as shown in distribution 401. The arrow shown at 420 indicates the shift in the Vt as a result of an LSB programming operation performed on any given cell being programmed in the array. Subsequent discussion of these Vt shifts, e.g., 420, 422 and 424, in the present specification may be referred to with a 'p' followed by the desired data state resulting from the programming operation. For example, 'p10' may be used to refer to the Vt shift indicated by 420 in the present specification. FIG. 4A also illustrates two verify points that may relate to LSB programming. (These two verify points will also be discussed subsequently in regards to FIG. 6A.) These are the pre-verify 410 and verify 412 points shown as 'Pre-pv10' and 'pv10' respectively in FIG. 4A. In general, during programming of a cell, the program operation may use a first verify voltage to determine when a cell is approaching its desired Vt, and then a second verify voltage to determine if a cell has reached its desired Vt. This allows the program operation to take a more aggressive approach at moving the cell's Vt during the initial programming, thereby increasing programming speed, then take a less aggressive approach at moving the cell's Vt during later cycles of the program operation to reduce the likelihood of overshoot of the corresponding Vt distribution. The aggressiveness of the programming operation can be regulated, e.g., slowed, by effectively altering the rate of change of the threshold voltage during the programming operation.

FIG. 4B illustrates the four potential Vt distributions 400-403 for at least one embodiment of the present disclosure. Other embodiments could have more Vt distributions depending on the number of bits to be stored. The arrows 422 and 424 indicate the shift in Vt as a result of an MSB programming operation, should such operation be performed. There are also two verify points shown in FIG. 4B. Verify point 'pv01' at 414 and verify point 'pv00' at 416 which are discussed subsequently. The concept of multiple verify levels for both of these Vt distributions is applicable, but not essential to the method. It should be noted the method of the embodiment shown in FIGS. 4B and 3B differs in at least one respect. In FIG. 3B, the Vt shift required to shift the Vt distribution from a bit pattern of '11' to '01' is much greater than from '10' to '00'. In both of these cases illustrated in FIG. 3B, the MSB is changing from a '1' to a '0'. As discussed above, MLC cells are programmed with a set of programming pulses wherein the voltage applied typically increases at each successive pulse by some increment Vstep. It should be noted that for a common word line programming voltage, it can take more and more pulses to shift the Vt of the MLC cell. For example it generally takes more pulses to adjust the Vt from 2V to 3V than from 1V to 2V. This is due to the accumulation of charge on the floating gates of the cells as their Vt is increased. Thus, referring to FIG. 3B the programming indicated by 312 may take a longer time and more programming pulses than the programming operation shown at 314. Additional programming pulses add time and increase the potential for Vpass and program disturb of adjacent cells. The method of one embodiment of the present disclosure illustrated in FIG. 4B addresses these issues. It should be noted that, in contrast with FIG. 3B, the magnitude of the shift of the Vt distribution in FIG. 4B indicated at 422 more closely resembles the magnitude of the shift indicated at 424. However, as discussed previously, the number of pulses required to shift the Vt distribution by a fixed amount generally increases as the Vt increases on the MLC. Thus, cells experiencing the programming operation shown at 422 may complete programming while cells experiencing the programming operation at 424 may require additional programming pulses. This issue is also addressed by the various embodiments of the present disclosure.

Although example embodiments are detailed with respect to a two-bit MLC, the concepts described herein may be extended to multilevel cells storing more than two bits of information. In the two-bit scenario, cells having a Vt within a first Vt distribution, e.g., distribution 400, are first shifted to a second Vt distribution, e.g., distribution 401 if a first bit, e.g., the LSB, is desired to be changed. To change a second bit of the MLC, cells within the first Vt distribution are then shifted to a third distribution, e.g., distribution 402, while cells within the second Vt distribution are then shifted to a fourth distribution, e.g., distribution 403. In the embodiments, the fourth Vt distribution 403 contains Vt levels greater than Vt levels within the third Vt distribution 402, the third Vt distribution contains Vt levels greater than Vt levels within the second Vt distribution 401, and the second Vt distribution contains Vt levels greater than Vt levels within the first Vt distribution 400. To extend this procedure to a three-bit MLC, consider the example of eight increasingly higher Vt distributions corresponding to bit patterns '111', '101', '011', '001', '110', '100', '010' and '000'. If a first bit is desired to be changed, the cell can be shifted from a first Vt distribution (corresponding to '111') to the fifth Vt distribution (corresponding to '110'). Subsequent programming of each set of four Vt distributions, i.e., first through fourth and fifth through eighth, can then follow the example of FIGS. 4A-4B. For example, if a second bit is desired to be changed, the cell is shifted up to the next higher Vt distribution from where it starts, and if a third bit is desired to be changed, the cell is shifted up by two Vt distributions from where it starts. In general, for an N-bit MLC, where N is an integer greater than 2, and having $2^N$ Vt distributions, changing a first bit can be attained by shifting the cell's Vt by $2^{N-1}$ distribution ranges, a subsequent bit change can be attained by shifting the cell's Vt by $2^{N-2}$ distribution ranges and so on until there are two bits remaining to be programmed. The next to last bit can then be changed by shifting the cell's Vt by one distribution range and the last bit can then be changed by shifting the cell's Vt by two distribution ranges.

Due to the structure of the array of memory cells, memory cells in a given row will all experience the same applied word line (programming) voltage pulses. Reducing the effective programming potential that cells experience will slow the programming process. The method of the present embodiment accomplishes this by determining which cells need the programming operation shown at 422 and which need the operation shown at 424. The programming method of the present disclosure biases up the bit lines associated with the 422 operation, effectively impeding the programming of these cells. The bit lines of the 424 operation cells are biased at 0V. Thus, by biasing the bit lines of the 422 operation up by some Vbias voltage, the programming operation can be adjusted to allow the 422 operation and 424 operation to be completed at approximately the same time. Thus, cells selected for programming and coupled to the same word line, having the same applied programming voltage, will have different resulting Vt distributions while reducing the possibility of Vpass and program disturb in adjacent cells. This method reduces the need for additional programming pulses of the 424 operation after the 422 operation has completed.

Figure 5:
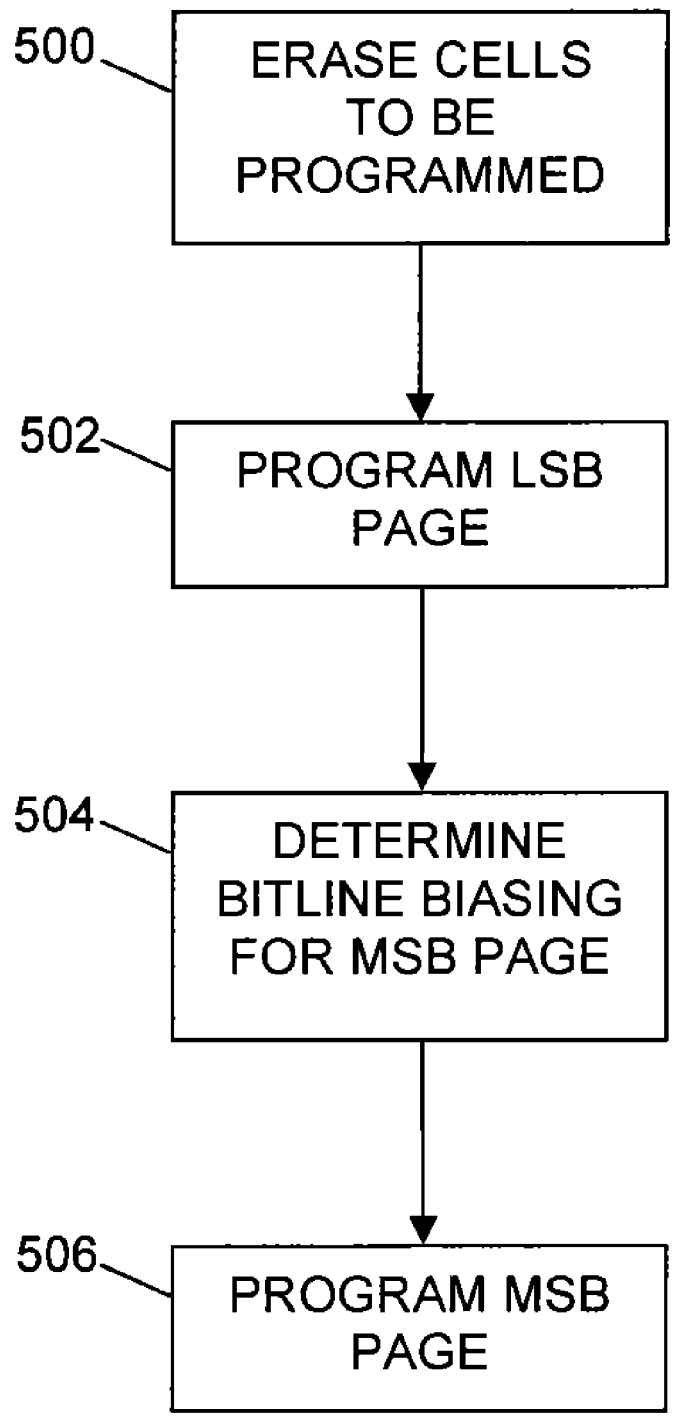
FIG. 5 is a flow chart for programming a MLC according to one embodiment of the disclosure.

FIG. 5 illustrates a method of programming an MLC NAND memory cell according to one embodiment of the present disclosure. Memory cells to be programmed are put into a condition for programming 500 by first bringing them within a voltage threshold range associated with an erased data value, e.g., a data state of '11' as in distribution 400 of FIG. 4A. The LSB page programming operation is then performed 502. After the first page, e.g., the LSB page, programming 502 is complete, a method 504 according to one embodiment of the present disclosure is employed to determine the bit line biasing required prior to programming the second page, e.g., the MSB page. Finally, the second or MSB page is programmed 506 per a method according to at least one embodiment of the present disclosure. As long as the first page of any given MLC or cell is programmed prior to the second page for any given memory cell, any variation of programming order will still be encompassed by the present embodiment. For example, the first e.g., LSB, page of a row may be programmed, then the second e.g., MSB, page of the same row is programmed. An alternative method may include programming multiple first pages of subsequent rows before returning to program the second pages. The present disclosure is thus not limited to programming MSB pages immediately following the respective LSB pages.

Figure 6A:
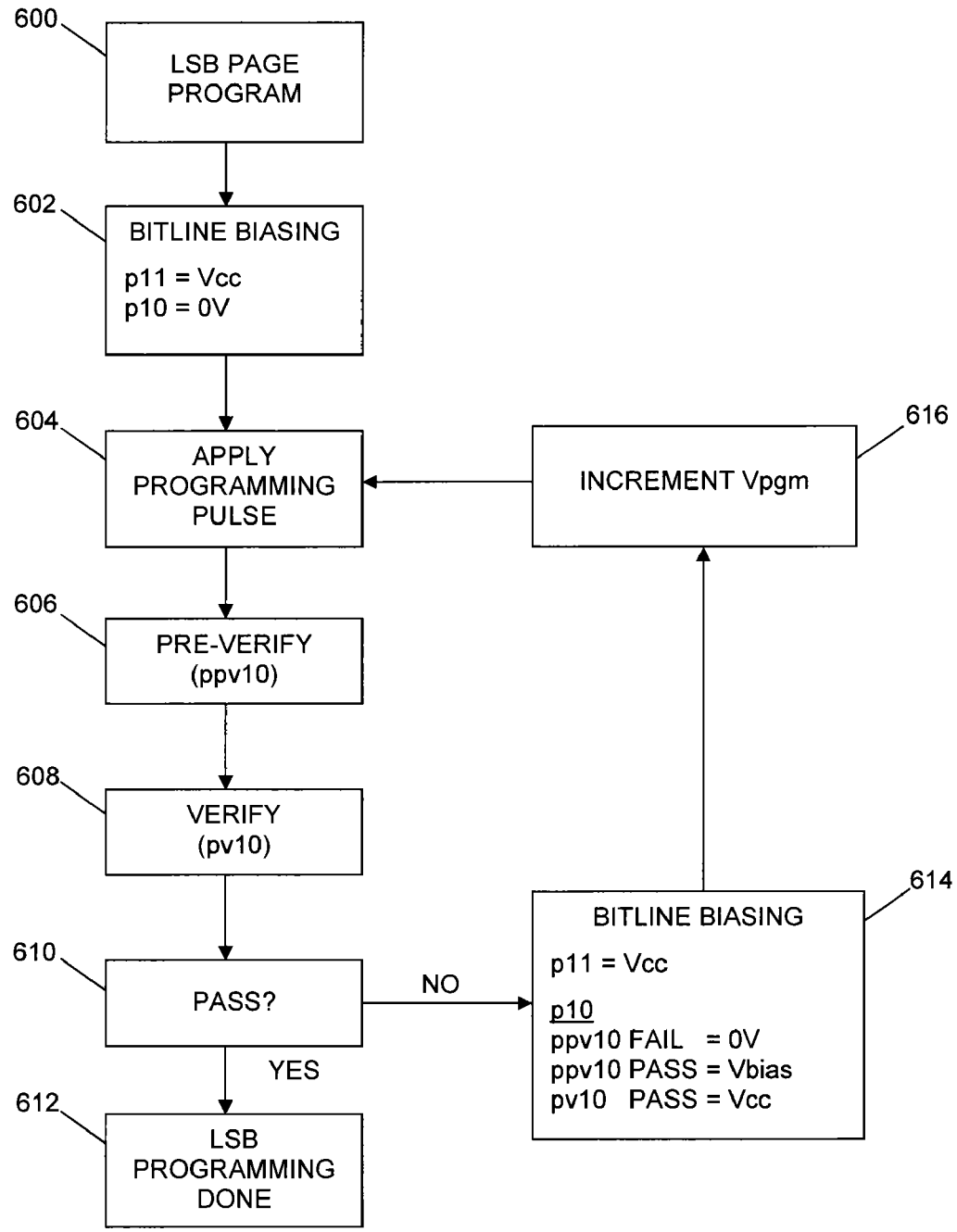
FIGS. 6A and 6B are flow charts of a process for programming a MLC according to one embodiment of the disclosure.

FIG. 6A illustrates a detailed method of programming the LSB page according to one embodiment of the present disclosure. The process shown in FIG. 6A, in one embodiment, corresponds to the process step 502 of FIG. 5. Referring to FIG. 6A, a determination 602 is made whether the current LSB bit to be programmed is a logical '1' or '0.' If the LSB bit is a logical '1,' no further action is required for the current cell because a logical value of '1' corresponds to an erased state. Thus, the associated bitline would be biased, e.g., with Vcc, to prevent altering the threshold voltage of that particular cell and effectively holding the threshold voltage of the cell in an erased data state. If the LSB bit to be programmed is a logical '0,' the associated bitline would be biased at 0V and a programming pulse 604 is applied to the cell to increase the Vt of the cell as shown at 420 in FIG. 4A. A pre-verify 606/410 and verify operation 608/412 are performed to determine if the Vt has been shifted to a desired threshold value. If the pre-verify fails, Vpgm is incremented and another programming pulse 604 is applied. The pre-verify 606/410 and verify operation 608/412 are performed again. This continues until the pre-verify passes. Additional programming pulses are applied after the pre-verify passes. However, the bit line associated with the cell being programmed is biased upwards 614 by some Vbias voltage. (see, 614, 'ppv10 PASS=Vbias.') For example, the bit line may be biased with a Vbias of a positive 0.6V. Other Vbias voltages could also be used as long as the bit line is not biased to a level that inhibits programming of the cell. Increasing levels of bias will further impede programming. The method of biasing the bit line upward as just described slows the programming process which can result in a tighter Vt distribution 401. Once the verify steps pass 610 for all LSB bits being programmed, programming of the LSB page is complete 612.

Figure 6B:
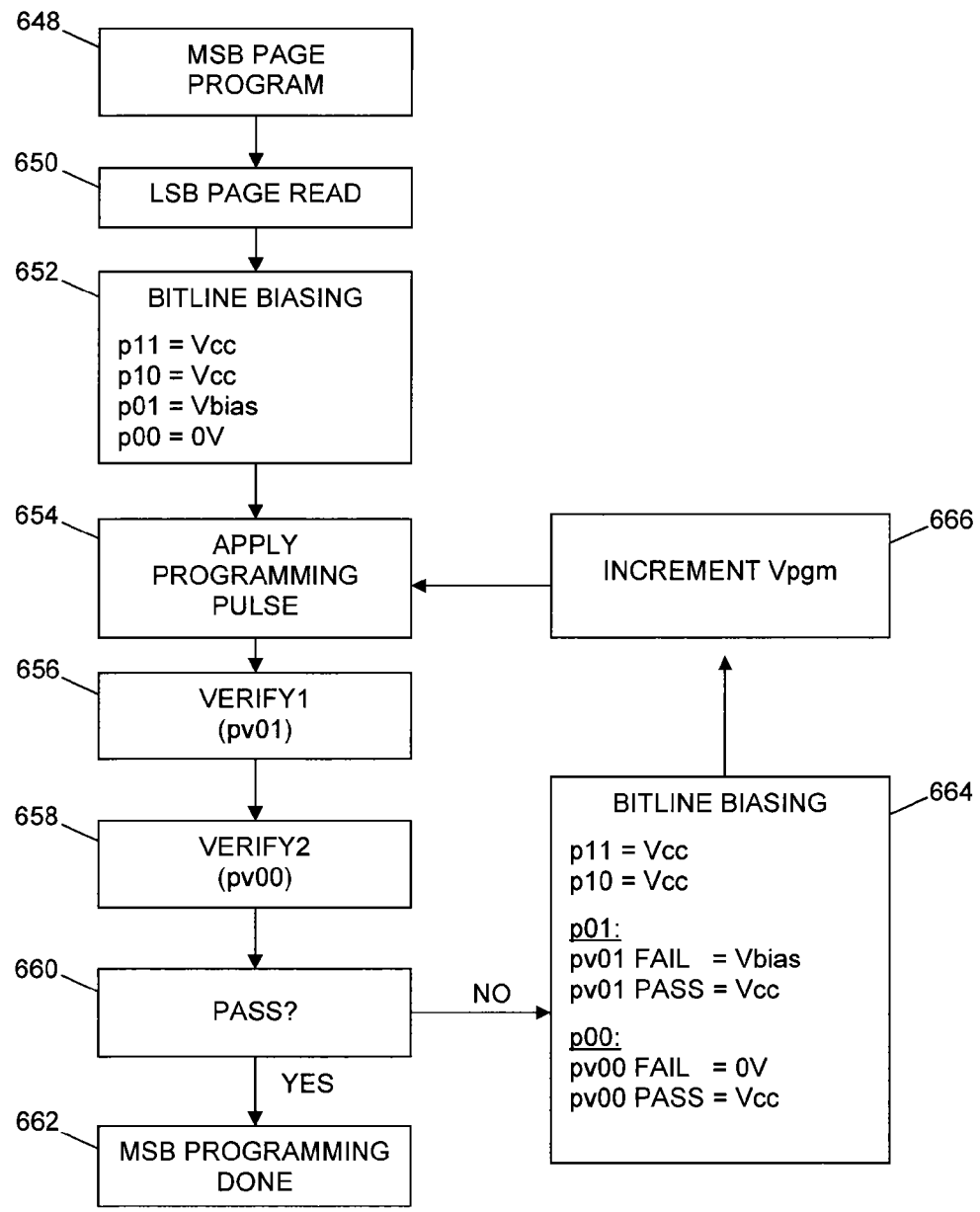

FIG. 6B illustrates a detailed method of programming the MSB page according to one embodiment of the present disclosure. With regards to the current MSB to be programmed 648, the associated LSB which was programmed as described previously by the method illustrated in FIG. 6A, is checked. Biasing of the associated bitlines 652 is determined based on the LSB bit. As illustrated at 652 of FIG. 6, the associated bitline would be biased at Vcc for a programming operation 'p 11' and 'pi 0,' 0V for a programming operation of 'p00' and Vbias for a programming operation of 'p01' For one embodiment, Vbias would be about 1V. Other voltages may be utilized in other embodiments. As a result of the elevated bit line biasing, e.g., with a Vbias voltage, MLCs that are being programmed from a '10' to '00' state will complete the Vt adjustment more closely to a MLC being programmed from a '11' to an '01' state, thus reducing Vpass and program disturb. A programming pulse is then applied 654. Verify operations 'pv01' 656/414 and 'pv00' 658/416 are performed. Results of the 'pv01' and 'pv00' verify operations are used to determine 664 the associated bitline biasing for any additional applied programming pulses 654. If additional programming pulses are to be applied, Vpgm is incremented 666 and another programming pulse is applied 654. Once the verify steps pass 660 for all MSB bits being programmed, the MSB page programming operation is complete 662.

Figure 7:
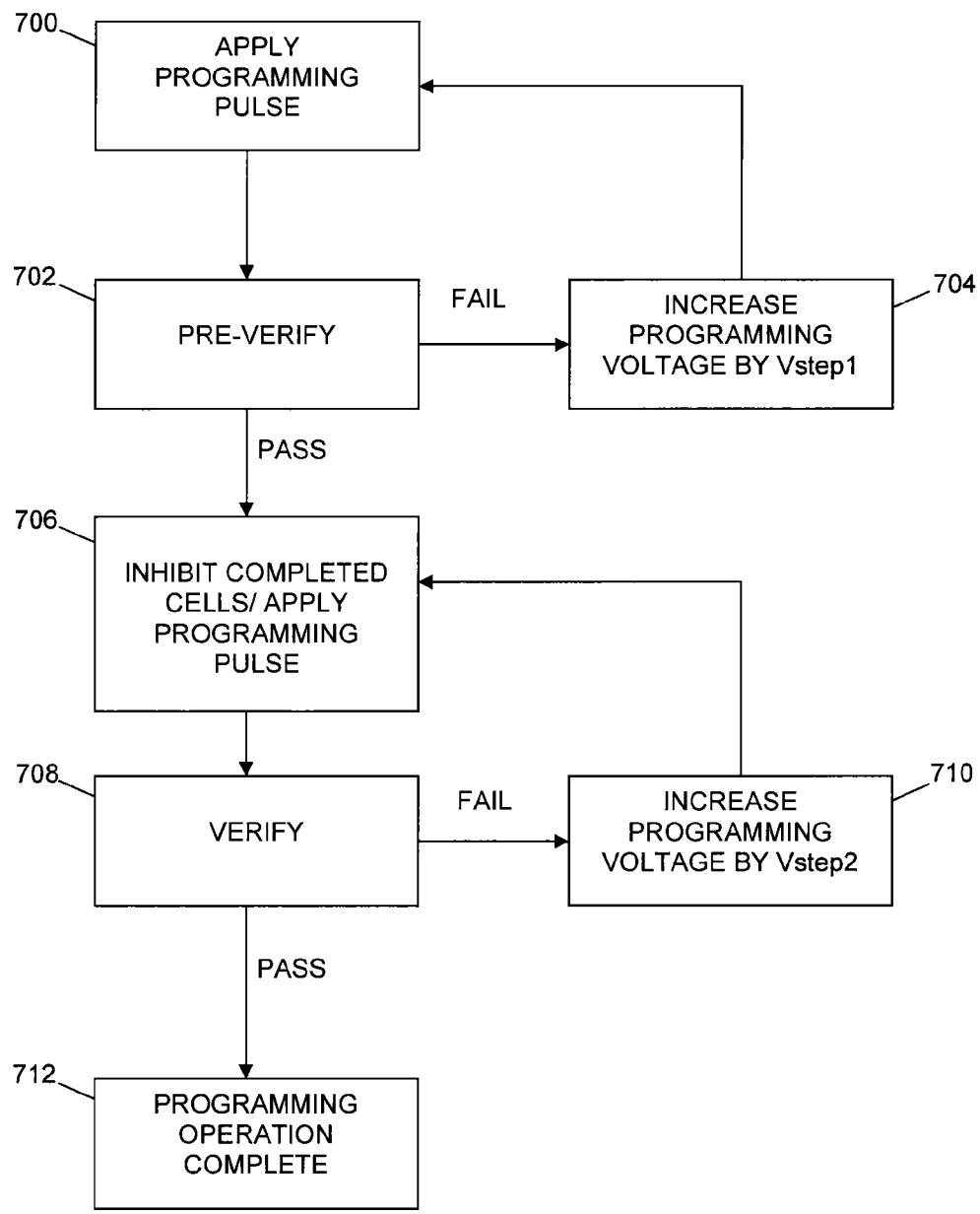
FIG. 7 is a flow chart of a programming operation for programming a MLC according to one embodiment of the disclosure.

The two programming operations 422 and 424 shown in FIG. 4B and detailed above still may not finish with exactly the same number of programming pulses being applied. The 424 operation still may require additional programming pulses to achieve the desired Vt distribution. Thus, in another embodiment of the present disclosure illustrated in FIG. 7, a small Vpgm step voltage 704 can be used to promote a narrow Vt distribution for the '11' to '01' 422 programming operation. After the pre-verify 'pv01' operation 414/702 is completed, the associated bit lines can be biased to inhibit programming 706 and a larger Vpgm step 710 can be applied to the remaining '00' Vt distribution memory cells to accelerate the completion of the programming operation 424. In the present embodiment illustrated in FIG. 7, Vstep2 710 is greater than Vstep1 704. Programming is complete when the verify operation 416/708 passes.

Figure 8:
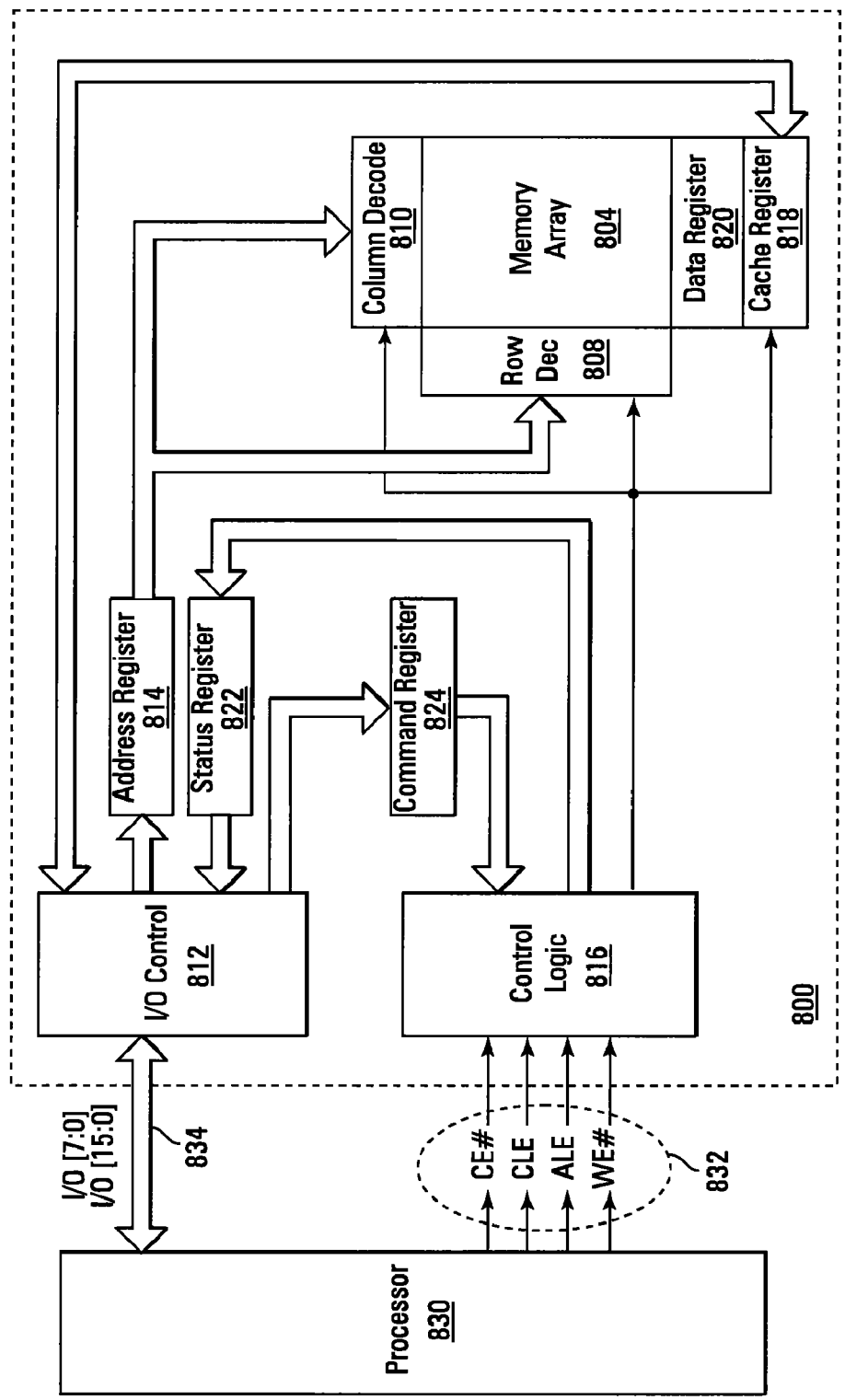
FIG. 8 is a functional block diagram of an electronic system having at least one memory device utilizing the method according to one embodiment of the disclosure.

FIG. 8 is a simplified block diagram of a memory device 800 in communication with (e.g., coupled to) a processor 830 as part of an electronic system, according to an embodiment of the disclosure. Some examples of electronic systems include personal computers, personal digital assistants (PDAs), digital cameras, digital media players, digital recorders, electronic games, electronic appliances, vehicles, wireless devices, mobile telephones and the like. The processor 830 may be a memory controller or other external processor.

Memory device 800 includes an array of memory cells 804 arranged in rows and columns. A row decode circuitry 808 and a column decode circuitry 810 are provided to decode address signals. Address signals are received and decoded to access memory array 804. Memory device 800 also includes input/output (I/O) control circuitry 812 to manage input of commands, addresses and data to the memory device 800 as well as output of data and status information from the memory device 800. An address register 814 is coupled between I/O control circuitry 812 and row decode circuitry 808 and column decode circuitry 810 to latch the address signals prior to decoding. A command register 824 is coupled between I/O control circuitry 812 and control logic 816 to latch incoming commands. Control logic 816 controls access to the memory array 804 in response to the commands and generates status information for the external processor 830. The control logic 816 is coupled to row decode circuitry 808 and column decode circuitry 810 to control the row decode circuitry 808 and column decode circuitry 810 in response to the addresses. Control logic 816 is adapted to perform methods of programming memory cells in accordance with one or more embodiments of the present disclosure.

Control logic 816 is also coupled to a cache register 818. Cache register 818 latches data, either incoming or outgoing, as directed by control logic 816 to temporarily store data while the memory array 804 is busy writing or reading, respectively, other data. During a write operation, data is passed from the cache register 818 to data register 820 for transfer to the memory array 804; then new data is latched in the cache register 818 from the I/O control circuitry 812. During a read operation, data is passed from the cache register 818 to the I/O control circuitry 812 for output to the external processor 830; then new data is passed from the data register 820 to the cache register 818. A status register 822 is coupled between I/O control circuitry 812 and control logic 816 to latch the status information for output to the processor 830.

Memory device 800 receives control signals at control logic 816 from processor 830 over a control link 832. The control signals may include a chip enable CE#, a command latch enable CLE, an address latch enable ALE, and a write enable WE# in accordance with the present invention. Memory device 800 receives commands (in the form of command signals), addresses (in the form of address signals), and data (in the form of data signals) from processor 830 over a multiplexed input/output (I/O) bus 834 and outputs data to processor 830 over I/O bus 834.

Specifically, the commands are received over input/output (I/O) pins [7:0] of I/O bus 834 at I/O control circuitry 812 and are written into command register 824. The addresses are received over input/output (I/O) pins [7:0] of bus 834 at I/O control circuitry 812 and are written into address register 814. The data are received over input/output (I/O) pins [7:0] for an 8-bit device or input/output (I/O) pins [15:0] for a 16-bit device at I/O control circuitry 812 and are written into cache register 818. The data are subsequently written into data register 820 for programming memory array 804. For another embodiment, cache register 818 may be omitted, and the data are written directly into data register 820. Data are also output over input/output (I/O) pins [7:0] for an 8-bit device or input/output (I/O) pins [15:0] for a 16-bit device. It will be appreciated by those skilled in the art that additional circuitry and signals can be provided, and that the memory device of FIG. 8 has been simplified to help focus on the present disclosure. Additionally, while the memory device of FIG. 8 has been described in accordance with popular conventions for receipt and output of the various signals, it is noted that the various embodiments are not limited by the specific signals and I/O configurations described unless expressly noted herein.

CONCLUSION

Various embodiments of the disclosure provide methods for programming multilevel cell NAND memory arrays and apparatus adapted to perform the methods. For one embodiment, four or more Vt distributions of increasingly higher ranges of Vt correspond to four or more data states that may be represented by bit patterns of two or more bits. Prior to programming, the target memory cells may be in a first of the Vt distributions corresponding to a first data state. Memory cells are shifted from the first Vt distribution to the next higher, or second, Vt distribution during a first portion of a programming operation if a second or a fourth data state is desired, while memory cells remain in the first Vt distribution if the first or a third data state is desired. During a second portion of the programming operating, if the third data state is desired, those memory cells are shifted from the first Vt distribution to a third Vt distribution higher than the second Vt distribution and, if the fourth data state is desired, those memory cells are shifted from the second Vt distribution to a fourth Vt distribution higher than the third Vt distribution.

Although specific embodiments have been illustrated and described herein, it will be appreciated by those of ordinary skill in the art that any method that is calculated to achieve the same purpose may be substituted for the specific embodiments shown. Many adaptations of the disclosure will be apparent to those of ordinary skill in the art. Accordingly, this application is intended to cover any adaptations or variations of the various embodiments.

What is claimed is:

1. A method of programming a memory cell, the method comprising:
   if it is desired to alter a first digit of a data value of the memory cell, shifting the memory cell from a first data state to a second data state; and
   if it is desired to alter a second digit of the data value of the memory cell, shifting the memory cell to a third data state if the memory cell is in the first data state and shifting the memory cell to a fourth data state if the memory cell is in the second data state;
   wherein the first, second, third and fourth data states correspond to respective non-overlapping ranges of threshold voltages, and wherein the threshold voltages corresponding to the fourth data state are greater than the threshold voltages corresponding to the third data state.

2. The method of claim 1, wherein shifting the memory cell further comprises shifting the memory cell by performing a programming operation on the memory cell to adjust a threshold voltage of the memory cell.

3. The method of claim 2, wherein shifting the memory cell by performing a programming operation further comprises performing a programming operation by applying one or more programming pulses to the memory cell.

4. The method of claim 2, wherein shifting the memory cell by performing a programming operation on the memory cell to adjust a threshold voltage of the memory cell further comprises performing a programming operation on the memory cell to adjust the threshold voltage at a first rate of change during a first portion of the programming operation, and performing a programming operation to adjust the threshold voltage at a second rate of change during a second portion of the programming operation.

5. The method of claim 2, wherein shifting the memory cell from a first data state to a second data state further comprises shifting the memory cell from the first data state to the second data state by adjusting the threshold voltage at a first rate of change prior to achieving a first verify voltage and adjusting the threshold voltage at a second rate of change prior to the memory cell achieving the second data state.

6. The method of claim 5, wherein adjusting the threshold voltage at the first rate of change further comprises adjusting the rate of change by biasing a bit line coupled to the memory device at a first bias level.

7. The method of claim 6, wherein adjusting the threshold voltage at the second rate of change further comprises adjusting the threshold voltage by biasing the bit line to a second bias level wherein the second bias level is chosen to reduce the rate of change of the threshold voltage relative to the first bias level.

8. The method of claim 2, further comprising biasing a bit line coupled to the memory cell during the programming operation to alter a rate of change of the memory cell threshold voltage.

9. The method of claim 8, wherein biasing the bit line further comprises biasing the bit line to a first bias level if the memory cell is shifting from the first data state to the third data state, and biasing the bit line to a second bias level if the memory cell is shifting from the second to the fourth data state, where the first bias level is different than the second bias level.

10. The method of claim 8, wherein biasing the bit line during the programming operation further comprises biasing the bit line to a first bias level during a first portion of the programming operation and biasing the bit line to a second bias level during a second portion of the programming operation.

11. The method of claim 10, wherein shifting the memory cell by performing a programming operation further comprises performing a programming operation by applying one or more programming pulses to the memory cell, and wherein the method further comprises performing a verify operation following each applied programming pulse to determine an indication of the memory cell threshold voltage.

12. The method of claim 11, wherein biasing the bit line further comprises biasing the bit line to the second bias level if the memory cell threshold voltage exceeds a first verify voltage, and biasing the bit line to a third bias level if the memory cell threshold voltage exceeds a second verify voltage.

13. The method of claim 12, wherein biasing the bit line to the second bias level seeks to reduce the shifting of the memory cell threshold voltage, and biasing the bit line to the third bias level seeks to prevent shifting of the memory cell threshold voltage level.

14. The method of claim 1, further comprising:
if it is desired to shift the memory cell to the third data state and to shift a different memory cell coupled to the memory cell to the fourth data state, shifting the memory cell to the third data state, wherein the memory cell achieves the third data state at approximately the same time as the different memory cell achieves the fourth data state.

15. The method of claim 1, further comprising:
if it is desired to shift the memory cell to the fourth data state and to shift a different memory cell coupled to the memory cell to the third data state, shifting the memory cell to the fourth data state, wherein the memory cell achieves the fourth data state at approximately the same time as the different memory cell achieves the third data state.

16. A method of programming a plurality of memory cells of a memory array, the method comprising:
for each memory cell of the plurality of memory cells for which it is desired to alter a first digit of a data value of those memory cells, shifting those memory cell from a first data state to a second data state; and
for each memory cell of the plurality of memory cells for which it is desired to alter a second digit of the data value of those memory cells, shifting those memory cells to a third data state if those memory cells are in the first data state and shifting those memory cells to a fourth data state if those memory cells are in the second data state;
wherein the first, second, third and fourth data states correspond to respective non-overlapping ranges of threshold voltages, and wherein the threshold voltages corresponding to the fourth data state are greater than the threshold voltages corresponding to the third data state; and
wherein shifting a data state of a memory cell of the plurality of memory cells comprises performing a programming operation on the memory cells of the plurality of memory cells to change a threshold voltage of each memory cell being shifted from one data state to another.

17. The method of claim 16, further comprising:
if it is desired to shift a first memory cell to the third data state and to shift the second memory cell to the fourth data state, altering the rate of change of the threshold voltage of the first and the second memory cells wherein the first memory cell and the second memory cell reach their intended data state at approximately the same time during a programming operation;
wherein a gate of the first memory cell and a gate of the second memory cell are commonly coupled.

18. The method of claim 17, wherein altering the rate of change of the threshold voltage of the first and the second memory cells further comprises altering the rate of change by biasing a first bit line coupled to the first memory cell with a first bias level and biasing a second bit line coupled to the second memory cell with a second bias level to alter a rate of change of first and the second memory cell threshold voltages such that the first and the second memory cells reach their intended data states at approximately the same time.

19. The method of claim 17, further comprising:
if it is desired to shift the first memory cell to the third data state and to shift the second memory cell to the fourth data state, applying one or more increasing programming pulses increasing by a first step amount until the first memory cell achieves the third data state, then increasing the applied programming pulses by a second step amount until the second memory cell achieves the fourth data state.

20. A control circuitry for a memory array, wherein the control circuitry is configured to:
shift a memory cell from a first data state to a second data state if it is desired to alter a first digit of a data value of the memory cell; and
if it is desired to alter a second digit of the data value of the memory cell, shift the memory cell to a third data state if the memory cell is in the first data state and shift the memory cell to a fourth data state if the memory cell is in the second data state;
wherein the first, second, third and fourth data states correspond to respective non-overlapping ranges of threshold voltages, and wherein the threshold voltages corresponding to the fourth data state are greater than the threshold voltages corresponding to the third data state.

21. The control circuitry of claim 20, wherein the control circuitry is further configured perform a programming operation on a row of memory cells to shift threshold voltages of one or more memory cells of the row of memory cells.

22. The control circuitry of claim 21, wherein the control circuitry is further configured to bias a bit line coupled to a first memory cell to a first bias level when the first memory cell is to be shifted from the first data state to the third data state, and to bias a bit line coupled to a second memory cell to a second bias level when the second memory cell is to be shifted from the second data state to the fourth data state, where the first bias level is different than the second bias level.

23. The control circuitry of claim 22, wherein the first bias level and the second bias level are adjusted to bias levels wherein the first memory cell achieves the third data state and the second memory cell achieves the fourth data state at approximately the same time during a programming operation.

24. The control circuitry of claim 22, wherein the control circuitry is further configured to apply one or more programming pulses with each applied pulse increasing by a first step increase prior to the first memory cell achieving the third data state, and to apply one or more additional programming pulses with each additional applied pulse having a second step increase after the first memory cell achieves the third data state and prior to the second memory cell achieving the fourth data state, where the second step increase is greater than the first step increase.

25. The control circuitry of claim 21, wherein the control circuitry is further configured to bias a bit line to a first level while a memory cell's threshold voltage is less than a verify voltage, and to bias the bit line to a second bias level when the memory cell's threshold voltage is greater than the verify voltage, where the verify voltage comprises a voltage less than a threshold voltage corresponding to the second data state.

* * * * *